United States Patent
Whitworth

(10) Patent No.: US 11,233,502 B2
(45) Date of Patent: Jan. 25, 2022

(54) VOLTAGE CLAMPING CIRCUIT

(71) Applicant: SEMICONDUCTOR COMPONENTS INDUSTRIES, LLC, Phoenix, AZ (US)

(72) Inventor: Adam John Whitworth, Mountain View, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/947,051

(22) Filed: Jul. 16, 2020

(65) Prior Publication Data

US 2021/0058077 A1 Feb. 25, 2021

Related U.S. Application Data

(60) Provisional application No. 62/890,690, filed on Aug. 23, 2019.

(51) Int. Cl.
| | | |
|---|---|---|
| *H03K 5/08* | (2006.01) | |
| *H02M 3/07* | (2006.01) | |
| *H03K 5/24* | (2006.01) | |
| *H03K 17/30* | (2006.01) | |
| *G05F 3/16* | (2006.01) | |

(52) U.S. Cl.
CPC ............. *H03K 5/08* (2013.01); *G05F 3/16* (2013.01); *H02M 3/073* (2013.01); *H03K 5/2436* (2013.01); *H03K 17/302* (2013.01)

(58) Field of Classification Search
CPC ........ H03K 5/08; H03K 5/2436; H03K 17/12; H03K 17/161; H03K 17/302; G05F 3/16; G05F 3/247
See application file for complete search history.

(56) References Cited

U.S. PATENT DOCUMENTS

| | | | |
|---|---|---|---|
| 6,232,832 B1 * | 5/2001 | Kirkpatrick, II | ......... G06G 7/25 327/309 |
| 6,897,703 B2 * | 5/2005 | Hunt | ........................ H03K 5/08 327/313 |

FOREIGN PATENT DOCUMENTS

| | | |
|---|---|---|
| CN | 101562443 A | 10/2009 |
| WO | 1989006068 A1 | 6/1989 |

* cited by examiner

*Primary Examiner* — Hai L Nguyen
(74) *Attorney, Agent, or Firm* — Brake Hughes Bellermann LLP

(57) ABSTRACT

In a general aspect, a circuit can include a pass device configured to receive an input voltage and provide an output voltage. The circuit can further include a current sink coupled with a control terminal of the pass device, the current sink being configured to discharge the control terminal of the pass device to limit the output voltage in response to the input voltage exceeding a threshold voltage. The circuit can also include a switch coupled in series with the current sink, the switch being configured to enable the current sink in response to the input voltage exceeding the threshold voltage.

20 Claims, 7 Drawing Sheets

VOLTAGE CLAMPING CIRCUIT

RELATED APPLICATION

This application claims the benefit of and priority to U.S. Provisional Application No. 62/890,690, filed Aug. 23, 2019, which is incorporated by reference herein in its entirety.

TECHNICAL FIELD

This description relates to circuits for limiting a voltage. More specifically, this disclosure relates to circuits for clamping a voltage applied to a circuit load.

BACKGROUND

Electrical devices and systems, such as consumer electronic devices, can be susceptible to damage from variations in voltages that are applied to such devices and systems. For instance, a voltage that is used to supply power (e.g., a input supply voltage) for an electronic device can vary. In situations where an input supply voltage exceeds a desired voltage (e.g., an overvoltage condition), damage can occur to components of an electronic device that are being supplied power from the input supply voltage. To prevent such damage from occurring, protective measures can then be taken in response to such overvoltage conditions.

Current approaches for overvoltage detection and protection (e.g., voltage limiting and/or voltage clamping circuits) have drawbacks, however. For instance, feedback circuits can be used for overvoltage limiting or clamping (voltage clamping), where the feedback circuit samples an output voltage and uses a control loop to maintain the output voltage at or below a desired (clamping) limit. Such feedback circuits, however, can be sensitive to components to which voltage is being supplied. For instance, there are some external components (e.g., due to capacitive coupling and/or inductive loading) that can cause such feedback control loops to be unstable in operation. Further, current approaches for implementing non-feedback voltage clamping circuits can also have drawbacks, such as high resistance below a clamping limit and/or variation in operation due to temperature.

SUMMARY

In a general aspect, a circuit can include a circuit can include a pass device configured to receive an input voltage and provide an output voltage. The circuit can further include a current sink coupled with a control terminal of the pass device, the current sink being configured to discharge the control terminal of the pass device to limit the output voltage in response to the input voltage exceeding a threshold voltage. The circuit can also include a switch coupled in series with the current sink, the switch being configured to enable the current sink in response to the input voltage exceeding the threshold voltage.

In another general aspect, a circuit can include a pass device configured to receive an input voltage and provide an output voltage. The circuit can also include a current sink coupled with a control terminal of the pass device. The current sink can be configured to discharge the control terminal of the pass device to limit the output voltage in response to the input voltage exceeding a threshold voltage. The circuit can further include a switch coupled in series with the current sink. The switch can be configured to enable the current sink in response to the input voltage exceeding the threshold voltage. The circuit can also include a voltage reference circuit coupled with a control terminal of the current sink. The voltage reference circuit can be configured to generate a voltage corresponding with the threshold voltage. The circuit can still further include an overvoltage detection circuit coupled to a control terminal of the switch. The overvoltage detection circuit being configured to turn off the switch to disable the current sink in response to the input voltage being less than or equal to the threshold voltage, and turn on the switch to enable the current sink in response to the input voltage being greater than the threshold voltage. The circuit can further include a charge pump coupled to the control terminal of the pass device, the charge pump being configured to receive the output voltage and provide a control voltage to the pass device, the control voltage being greater than the output voltage.

In another general aspect, a method of operating a circuit can include receiving an input voltage at a pass device of the circuit, providing, with the pass device, an output voltage based on the input voltage. The method can further include determining that the input voltage exceeds a threshold voltage. In response to the input voltage exceeding the threshold voltage the method can include enabling a current sink coupled with a control terminal of the pass device, and discharging, with the current sink, the control terminal of the pass device to limit the output voltage.

BRIEF DESCRIPTION OF THE DRAWINGS

Like reference symbols in the various drawings indicate like and/or similar elements.

DETAILED DESCRIPTION

This disclosure relates to approaches, e.g., circuits and associated methods, for voltage limiting and/or voltage clamping (hereafter "voltage clamping"). The approaches described herein can overcome at least some of the drawbacks of current approaches. For instance, in the implementations described herein, voltage is clamping is performed based on an input voltage, rather than an output voltage that is sampled using a feedback circuit. Accordingly, the approaches described herein not susceptible to instability of such feedback loops. Further, because the approaches for voltage clamping (limiting) described herein are performed based on an input voltage, effects of capacitive and/or inductive loading of an output voltage are reduced.

The circuits described herein can be configured to reduce sensitivity to temperature, as compared with current implementations. For instance, in the example implementations, a circuit used to generate a reference voltage used for determining overvoltage can be configured to have elements (e.g., a resistor and a current source) with complimentary temperature effects. Also, because the example implementations described herein do not include a feedback circuit, such implementations, when implemented in semiconductor device (chip), can have a reduced area as compared to current implementations, and a lower manufacturing cost.

Figure 1:
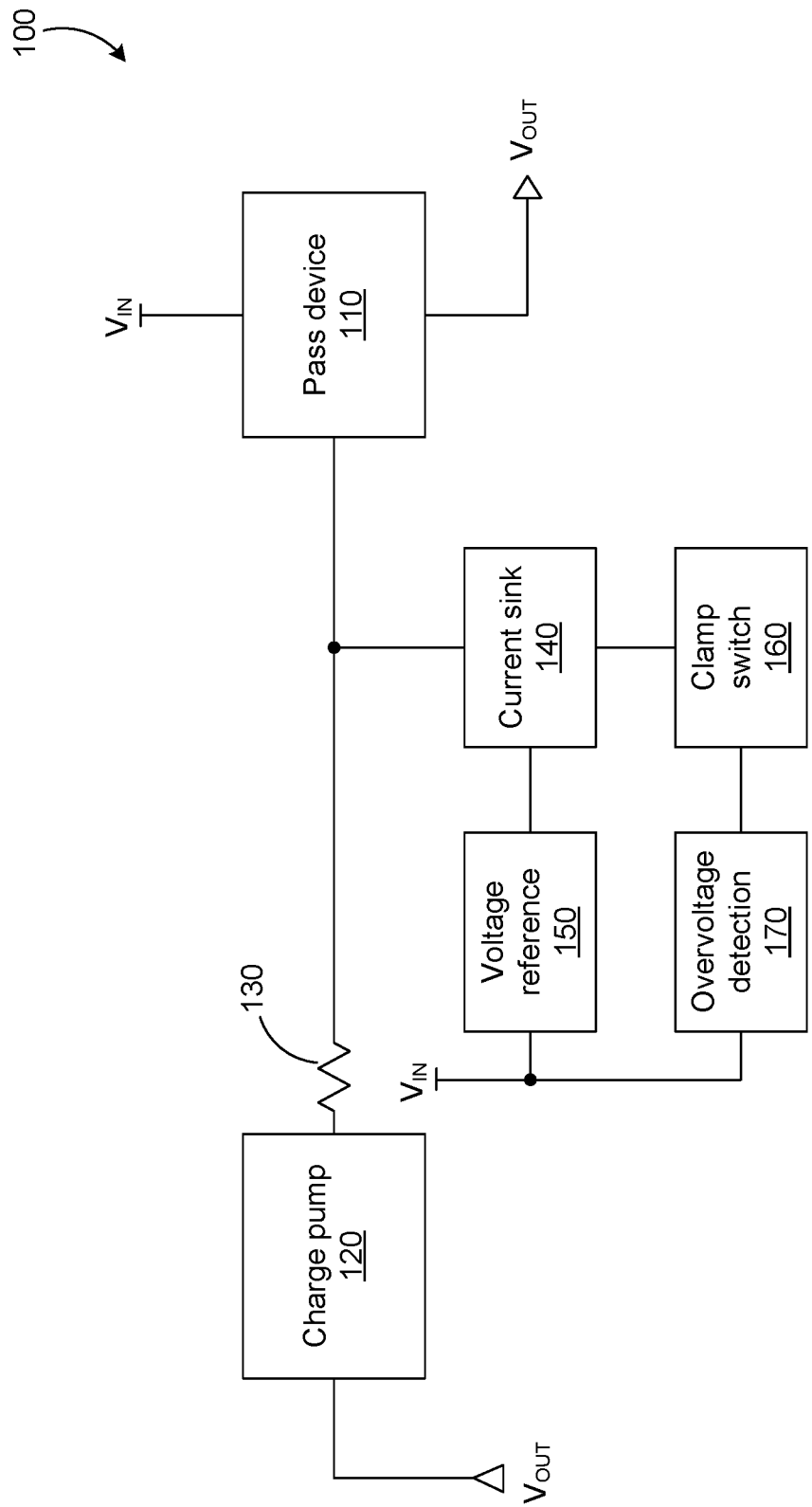
FIG. 1 is a block diagram illustrating a voltage clamping circuit, according to an implementation.

FIG. 1 is a block diagram illustrating a voltage clamping circuit 100, according to an implementation. As shown in FIG. 1, the circuit 100 includes a pass device 110 that can receive an input voltage $V_{IN}$ and generate (pass) an output voltage $V_{OUT}$ that is based on $V_{IN}$. In the circuit 100, when $V_{IN}$ is at or below a threshold voltage (clamp voltage, voltage clamping limit, etc.), $V_{OUT}$ can be a non-limited (unclamped) version of $V_{IN}$. When $V_{IN}$ is above the threshold voltage, the pass device 110 can be operated, using the approaches described herein, so as to limit (clamp) $V_{OUT}$ to a voltage that corresponds with (is equal to, is approximately equal to, etc.) the threshold (clamping) voltage of the circuit 100.

As shown in FIG. 1, the circuit 100 can also include a charge pump 120 and a resistor 130. The charge pump 120 of the circuit 100 can receive $V_{OUT}$ and generate, from $V_{OUT}$, a control voltage for the pass device 110 that is greater than $V_{OUT}$. For instance, in some implementations, the pass device 110 can be implemented using a transistor device (e.g., an n-channel field-effect transistor (FET), an NPN bipolar junction transistor (BJT), an n-channel insulated-gate bipolar transistor IGBT, and so forth). The control voltage generated by the charge pump 120 can be a voltage that is sufficient, when $V_{IN}$ is less than or equal to the threshold voltage, to operate the pass device 110 with low conduction resistance (e.g., to operate in a linear region or linear mode for an n-channel FET). The resistor 130 can limit current (e.g., gate current) applied to the control terminal of the pass device 110. In some implementations, the resistor 130 can be included in the charge pump 120 (e.g., as an output impedance).

As shown in FIG. 1, the circuit 100 also includes a current sink 140, a voltage reference circuit 150, a clamp switch 160 and an overvoltage detection circuit 170. As shown in FIG. 1, the current sink 140 can be coupled with the pass device 110 (e.g., with a control terminal of the pass device 110) and the clamp switch 160 can be coupled in series with the current sink 140. In some implementations, the current sink can be implemented using a p-channel FET, a PNP BJT, etc., and the clamp switch 160 can be implemented using an n-channel FET, an NPN BJT, and n-channel IGBT, a relay, etc. As also shown in FIG. 1, the voltage reference circuit 150 and the overvoltage detection circuit 170 can receive $V_{IN}$.

In the circuit 100, the voltage reference circuit 150 is coupled with the current sink 140, and can be configured to provide a reference voltage (e.g., from $V_{IN}$) that, accounting for circuit variation, is close to a voltage clamping limit (threshold voltage) of the circuit 100. The overvoltage detection circuit 170 is coupled with the clamp switch 160, and can be configured to provide a logic signal on a control terminal of the clamp switch 160, where the logic signal can indicate whether $V_{IN}$ is above the threshold voltage (using a first logic value), or $V_{IN}$ is at or below (less than or equal to) the voltage threshold (using a second logic value).

When the logic signal provided by the overvoltage detection circuit 170 indicates that $V_{IN}$ is at or below the voltage threshold, the clamp switch 160 can be off (open), such that the current sink 140 is disabled, and the pass device 110 can operate with low conduction resistance (e.g., $V_{OUT}$ is an unclamped version of $V_{IN}$). However, when the logic signal provided by the overvoltage detection circuit 170 indicates that $V_{IN}$ is above (exceeds, is greater than, etc.) the voltage threshold, the clamp switch 160 can be on (closed), such that the current sink 140 is enabled, and the pass device 110 can operate with high conduction resistance ($V_{OUT}$ is a clamped version of $V_{IN}$). For instance, in some implementations, such as in the circuits of FIGS. 4A and 4B, the current sink 140, when enabled, can be configured to discharge a control terminal (e.g., a gate terminal) of the pass device 140, which can be implemented by, e.g., an n-channel FET. In this example, the current sink can discharge the gate of the FET (overcoming the increased voltage generated by the charge pump 120), such that the FET operates in saturation (with high channel resistance) and clamps $V_{OUT}$ to a voltage corresponding with (equal to, approximately equal to, etc.) the threshold voltage (voltage claiming limit).

Figure 2:
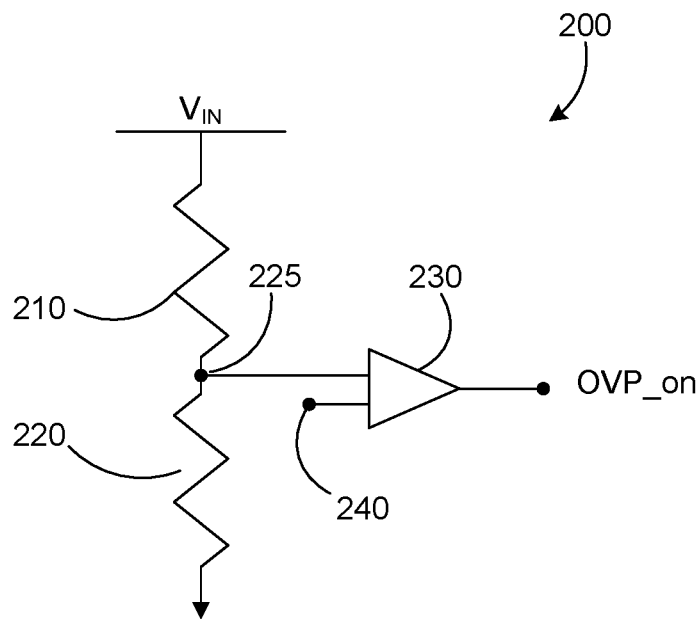
FIG. 2 is a schematic diagram illustrating an overvoltage detection circuit that can be implemented in the voltage clamping circuit of FIG. 1.

FIG. 2 is a schematic diagram illustrating an overvoltage detection circuit 200 that can be implemented in the voltage clamping circuit 100 of FIG. 1 (e.g., as overvoltage detection circuit 170). Accordingly, for purposes of illustration, the circuit 200 is described with further reference to FIG. 1. The overvoltage detection circuit 200 of FIG. 2 is given by way of example, and other configurations of an overvoltage detection circuit can be used in the circuits described herein.

As shown in FIG. 2, the overvoltage detection circuit 200 includes a resistor 210 and a resistor 220 that define a resistor divider between $V_{IN}$ and electrical ground. Accordingly, in the overvoltage detection circuit 200, a divided voltage present on a node 225 of the circuit 200 is, based on the values of the resistors 210 and 220, proportional to $V_{IN}$. The circuit 200 also includes a comparator 230 that is configured to compare the voltage on the node 225 with a reference voltage applied to the terminal 240 of the comparator 230. In this example, the reference voltage applied to the terminal 240 can correspond with a voltage clamping limit (with a same proportion as the divided voltage) of the circuit 100.

In the circuit 200, the comparator 230 can be configured to generate an overvoltage protection ON (OVP_on) logic signal based on the comparison of the voltage on the node 225 and the reference voltage applied to the terminal 240. For instance, the OVP_on signal can have a first logic value (e.g., logic 0) when the voltage on the node 225 is less than or equal to the reference voltage applied to the terminal 240 (e.g., $V_{IN}$ is less than or equal to a voltage clamping limit of the circuit 100). Further, the OVP_on signal can have a second logic value (e.g., logic 1) that is opposite the first logic value when the voltage on the node 225 is greater than the reference voltage applied to the terminal 240 (e.g., $V_{IN}$ is greater than the voltage clamping limit). Accordingly, because the OVP_on logic signal indicates when $V_{IN}$ is greater than the voltage clamping limit, the OVP_on logic signal can be used to control the clamp switch 160. For instance, the OVP_on logic signal can be used to turn the clamp switch 160 off, and disable the current sink 140 when the OVP_on signal is logic 0 (e.g., $V_{IN}$ is less than or equal to the voltage clamping limit), or turn the clamp switch 160 on to enable the current sink 140 (to discharge a control terminal of the pass device 110 and limited $V_{OUT}$) when the OVP_on signal is logic 1 (e.g., $V_{IN}$ is greater than the voltage clamping limit).

Figure 3A:
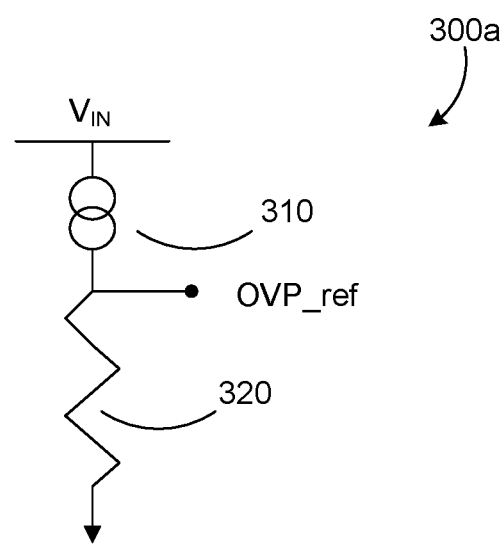
FIG. 3A is a schematic diagram illustrating a voltage reference circuit that can be implemented in the voltage clamping circuit of FIG. 1.
Figure 3B:
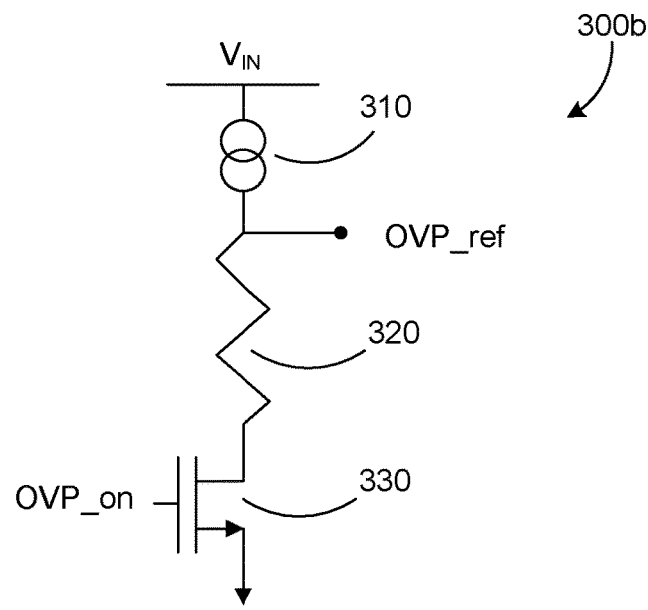
FIG. 3B is a schematic diagram illustrating another voltage reference circuit that can be implemented in the voltage clamping circuit of FIG. 1.

FIG. 3A is a schematic diagram illustrating a voltage reference circuit 300a that can be implemented in the voltage clamping circuit of FIG. 1. FIG. 3B is a schematic diagram illustrating another voltage reference circuit 300b that can also be implemented in the voltage clamping circuit of FIG. 1. Accordingly, for purposes of illustration, the circuits 300a and 300b are described with further reference to FIG. 1. The circuits 300a and 300b are similar, and like elements in the circuits 300a and 300b are referenced with the like reference characters. The voltage reference circuits 300a and 300b of FIGS. 3A and 3B are given by way of example, and other configurations of voltage reference circuits can be used in the circuits described herein.

Referring to FIGS. 3A and 3B, both voltage reference circuits 300a and 300b are configured to generate an overvoltage protection reference voltage (OVP_ref), where the OVP_ref voltage is, accounting for circuit variations, equal to (e.g., approximately equal to, substantially equal to, etc.) a voltage clamping limit of the circuit 100. As shown in FIGS. 3A and 3B, the circuits 300a and 300b each include a current source 310 that is configured to receive the input voltage $V_{IN}$. In the example implementations, the current source 310 and the resistor 320 can be configured to (based on $V_{IN}$), generate the OVP_ref voltage. The OVP_ref reference voltage can, in turn, be applied to a control terminal of the current sink 140 (e.g., a p-channel FET, a PNP transistor, etc.), where the current sink 140 can operate as described herein to limit (clamp) an output voltage ($V_{OUT}$). As noted above, to reduce temperature sensitivity of the voltage reference circuit 300a and 300b, the current source 310 and the resistor 320 can be designed to have complimentary temperature effect, such that the circuits 300a and 300b generate a consistent voltage across a desired range of temperatures.

The voltage reference circuit 300b of FIG. 3B differs from the voltage reference circuit 300a of the FIG. 3A, in that the circuit 300b includes an n-channel FET 300 that is controlled by the OVP_on logic signal, such as described with respect to FIG. 2. Accordingly, the circuit 300b will be disabled (e.g., will not generate an OVP_ref voltage corresponding with a voltage clamping limit) when OVP_on is logic 0 (e.g., $V_{IN}$ is less than or equal to a voltage clamping limit). When OVP_on is logic 1 0 (e.g., $V_{IN}$ is less than or equal to a voltage clamping limit), the circuit 300b will be enabled (e.g., will generate an OVP_ref voltage corresponding with a voltage clamping limit). In this example, current of a supply providing $V_{IN}$ can be reduced.

Figure 4A:
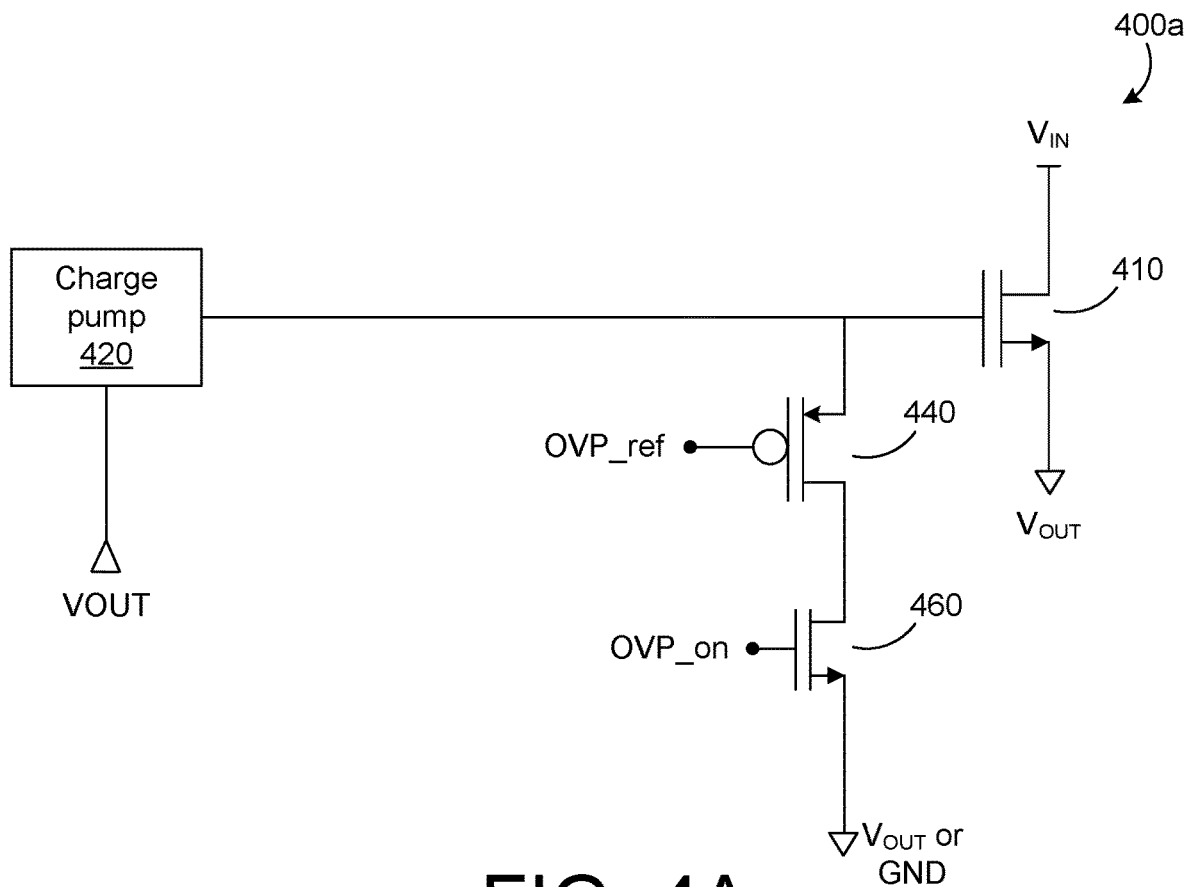
FIG. 4A is a schematic diagram illustrating a voltage clamping circuit, according to an implementation.
Figure 4B:
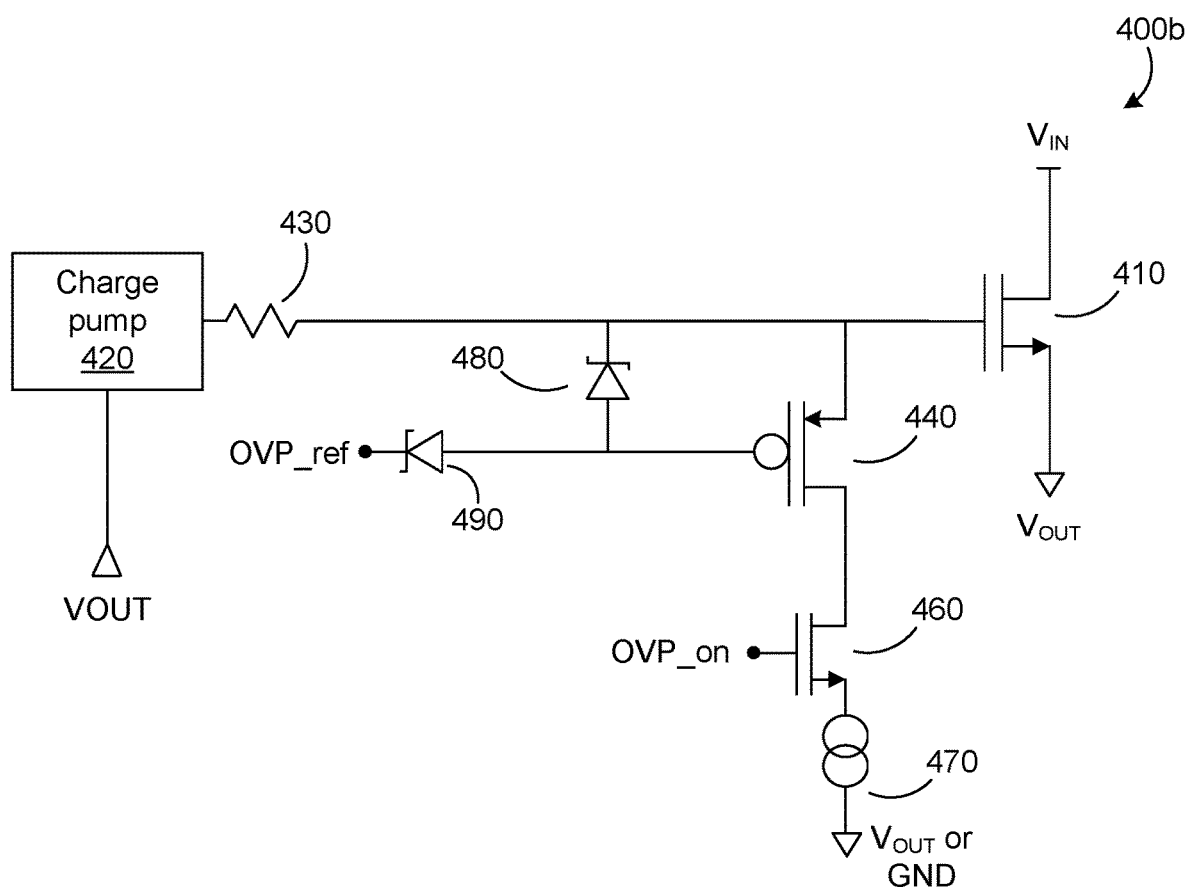
FIG. 4B is a schematic diagram illustrating another voltage clamping circuit, according to an implementation.

FIG. 4A is a schematic diagram illustrating a voltage clamping circuit 400a, according to an implementation. FIG. 4B is a schematic diagram illustrating another voltage clamping circuit 400b, according to an implementation. The circuits 400a and 400b are similar, and like elements in the circuits 400a and 400b are referenced with like reference characters. In some implementations, the circuits 400a and 400b can implement the circuit 100 of FIG. 1. Accordingly, for purposes of illustration, the circuits 400a and 400b will be described with further reference to FIG. 1. However, in some implementations, circuits having other configurations can be used to implement the voltage clamping circuit 100 of FIG. 1.

In FIGS. 4A and 4B, the voltage reference circuit 150 and the overvoltage detection circuit 170 of FIG. 1 are not shown, however respective terminals for applying an OVP_ref voltage and an OVP_on logic signal (such as described with respect to FIGS. 2, 3A and 3B) are indicated in the circuits 400a and 400b. In some implementations, the circuits of FIGS. 2, 3A and/or 3B can be implemented in the circuits of FIGS. 4A and 4B, such as to implement the circuit 100.

Referring to FIGS. 4A and 4B, the circuits 400a and 400b include a charge pump 420, that can implement the charge pump 120 of the circuit 100. In the circuit 400a, a resistor for limiting gate current of a pass device that is implemented using an n-channel FET 410 can be included in the charge pump 420 (e.g., as an output impedance of the charge pump 420). In these examples, the FET 410 implements the pass device 110 of the circuit 100. In comparison with the circuit 400a, the circuit 400b includes a current limiting resistor 430 that can be used to limit a gate current of the FET (pass device) 410. In the circuits 400a and 400b, the current sink 140 of the circuit 100 is implemented using a p-channel FET 440, and the clamp switch 160 is implemented using an n-channel FET 460. The circuit 400b of FIG. 4B further includes, as compared to the circuit 400a, a current sink 470, a first (Zener) diode 480, and a second (Zener) diode 490.

In the circuits 400a and 400b, similar to the current source 140 and the pass device 110 of FIG. 1, the p-channel FET (current sink) 440 is coupled with the gate terminal of the n-channel FET (pass device) 410 (e.g., a source of the FET 440 is coupled with the gate of the FET 410). Further, the FET (current sink) 440 is configured to receive the OVP_ref voltage (from a voltage reference circuit) on its gate terminal. Further, similar with the clamp switch 160 of FIG. 1, the n-channel FET 460 is coupled in series with the FET 440 (e.g., between a drain of the FET 440 and either $V_{OUT}$ or electrical ground). Further, the FET (clamp switch) 460 is configured to receive the OVP_on logic signal on its gate terminal. As discussed with respect to the current sink 140 of the circuit 100, the FET (current sink) 440 can be configured to only sink current when it is enabled (e.g., if the OVP_on logic signal is logic 1 and the FET (clamp switch) 460 is on and conducting), such as when $V_{IN}$ exceeds the threshold (clamp) voltage of the circuit 400a or 400b, and $V_{OUT}$ then is a clamped version of $V_{IN}$.

In the circuit 400a, when OVP_on is logic 1, a voltage on the gate of the FET (pass device) 410, due to conduction of the FET (current sink) 440 will be equal to the OVP_ref voltage+a threshold voltage of the FET 440. In the circuit 400b, when OVP_on is logic 1, a voltage on the gate of the FET (pass device) 410, due to conduction of the FET (current sink) 440, will be equal to the OVP_ref voltage+a threshold voltage of the FET 440+a forward voltage of the diode 490. Accordingly, in the circuits 400a and 400b, when OVP_on is logic 1, $V_{OUT}$ should not exceed OVP_ref (e.g., the threshold or clamping voltage of the circuit). In some implementations, there may be minor variations in $V_{OUT}$ due to circuit variations, such as variation in the threshold voltages of the p-channel (current sink) FET 440 and the n-channel (pass device) FET 410.

In the circuits 400a and 400b, the FET 440 becomes conductive (sinks current) as a result of OVP_on being asserted, or set to logic 1 (e.g., the FET 460 is on and conducting) and the gate terminal of the FET (pass device) 410 is greater than the OVP_ref voltage by a threshold voltage the FET (current sink) 440. As previously discussed, the FET (clamp switch) 460 conducts (is on) when the OVP_on logic signal is logic 1. This allows current to be pulled (sunk) from the gate of the FET 410 through the FET 440, which limits a voltage on the gate terminal of the FET 410, such as was discussed above.

In the circuit 400b, the current sink 470 can be configured to limit current (e.g., from the gate terminal of the FET 410) through the FET 440 and the FET 460, to prevent damage to those devices from transient current surges. The diode 480 can prevent a gate-to-source voltage of the FET 440 from exceeding a safe value and, as result, protect the FET 440 from associated electrical damage. Further in the circuit 440b, the diode 490 can allow the FET 410 to be turned off (e.g., where a gate voltage of the FET 410 is 0 V) without the OVP_ref voltage being disturbed (altered from a desired value), or current being consumed from a $V_{IN}$ power supply, by a current source used to generates the OVP_ref voltage.

Figure 5:
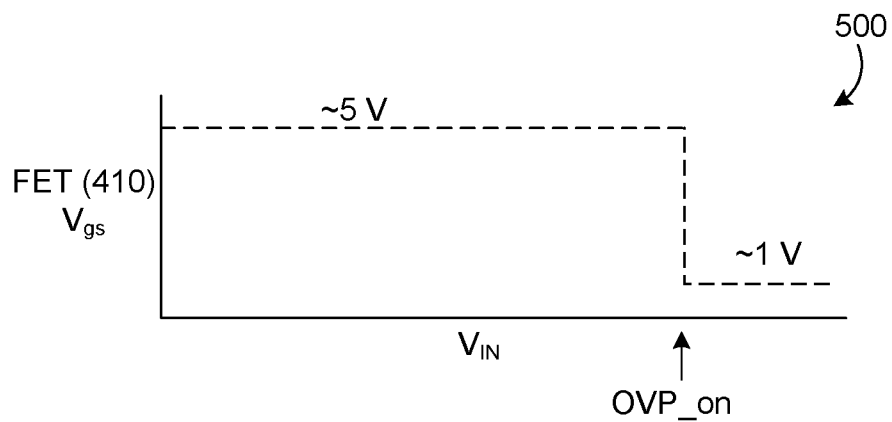
FIG. 5 is a graph illustrating operation of a pass device in a voltage clamping circuit, such as the voltage clamping circuits of FIGS. 4A and 4B.

FIG. 5 is a graph 500 illustrating operation of a pass device in a voltage clamping circuit, such as the n-channel FET 410 of the voltage clamping circuits of FIGS. 4A and 4B. The graph 500 of FIG. 5 illustrates a gate-to-source voltage ($V_{gs}$) of the FET 410 during operation of implementations of the circuits 400a and 400b. Specifically, the graph 500 illustrates $V_{gs}$ of the FET 410 (y-axis) versus the input voltage $V_{IN}$ (x-axis). In this example, the FET 410 is a 5 volt (V) device, though devices with other operating voltages (e.g., 2 V, 3 V, 10 V, etc.) can be used. In the graph 500, the indication of OVP_on on the x-axis indicates where $V_{IN}$ exceeds a voltage clamping limit of the circuits 400a and 400b, causing OVP_on to change logic states (e.g., from logic 0 to logic 1) and enable the current sink (p-channel FET 440) to sink current and discharge the gate of the FET 410. As shown in FIG. 5, in this example, when $V_{IN}$ is less than or equal to the voltage clamping limit (e.g., OVP_on is logic 0), $V_{gs}$ of the FET 410 is approximately 5 V and the FET 410 will conduct with low resistance (in linear mode), such that $V_{OUT}$ will be approximately equal to (track with) $V_{IN}$, such as is illustrated in FIG. 6.

Figure 6:
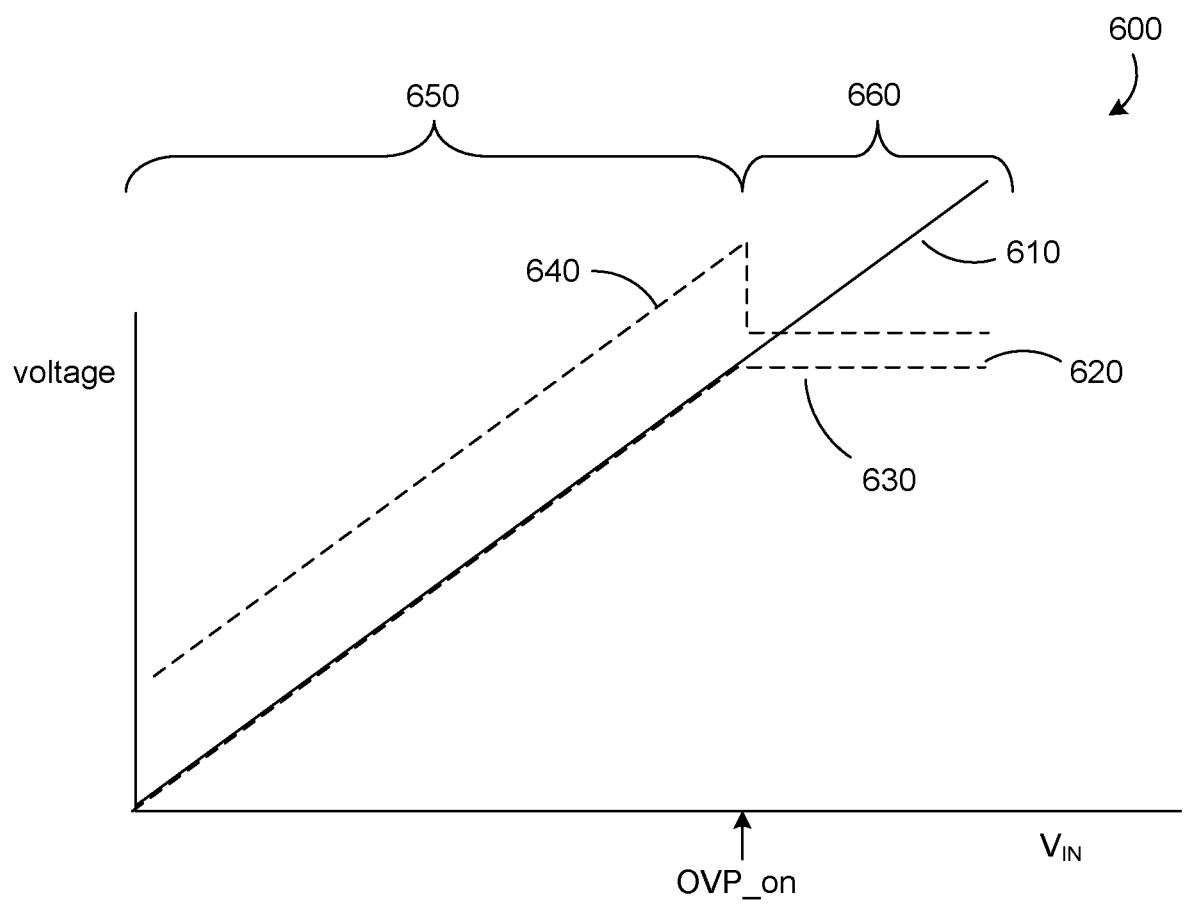
FIG. 6 is a graph illustrating operation of a voltage clamping circuit, such as the voltage clamping circuits of FIGS. 4A and 4B.

As also shown in FIG. 5, when $V_{IN}$ is greater than the voltage clamping limit (e.g., OVP_on is logic 1), $V_{gs}$ of the FET 410 is approximately 1 V (e.g., due to the threshold voltage $V_t$ of the p-channel FET 440) and that the FET 410 will conduct with high resistance (in saturation mode), such that $V_{OUT}$ will be limited (clamped) to the voltage clamping limit, as is also shown in FIG. 6.

FIG. 6 is a graph 600 illustrating operation of a voltage clamping circuit, such as the voltage clamping circuits 400a and 400b of FIGS. 4A and 4B. Accordingly the graph 600 will be further described with reference to the circuit 400a and 400b of FIGS. 4A and 4B. The graph 600 illustrates, for the example circuits 400a and 400b, the input voltage $V_{IN}$ (trace 610), the gate voltage $V_{gs}$ of the FET (pass device) 410 (trace 620), and $V_{OUT}$ (trace 630) across a range of $V_{IN}$ voltages. In the graph 600, as with the graph 500 of FIG. 5, OVP_on is indicated on the x-axis to correspond with a voltage clamping limit (threshold voltage) at which the OVP_on logic signal is asserted (e.g., changes to logic 1). As with the graph 500 of FIG. 5, FIG. 6 illustrates operation of, e.g., the circuits 400a and/or 400b, where the FET (pass device 410) is implemented using a 5V operation n-channel FET device.

The portion of the graph indicated by the bracket 650 corresponds with $V_{IN}$ voltages that are at or below a threshold (clamping) voltage of the example circuits (e.g., OVP_on is logic 0). The portion of the graph indicated by the bracket 660 corresponds with $V_{IN}$ voltages that are above the threshold (clamping) voltage of the example circuits (OVP_on is logic 1). As shown in FIG. 6, for this example, in the region of the graph indicated by the bracket 650, a gate voltage $V_{gs}$ of the FET (pass device) 410 is high (~5V greater than $V_{IN}$ and $V_{OUT}$, where $V_{IN}$ tracks with $V_{OUT}$). Accordingly, a drain to source $V_{ds}$ voltage of the FET 110 in the region 650 of the graph 600 would be low (e.g., ~0.1 V in this example), as the FET 410 is operating in its linear region, and resistance between $V_{IN}$ and $V_{OUT}$ (e.g., though a channel of the FET 110) is low.

As also shown in FIG. 6, in the region indicated by the bracket 660, due to conduction of current by the FET (current sink) 440, the gate voltage $V_{gs}$ of the FET (pass device) 410 is low (e.g., ~1 V), while Vds of the FET 410 is high due to operation of the FET 410 in its saturated region. As shown in FIG. 6, for Vin values above the threshold voltage (greater than OVP_ref), the circuits 400a and 400b, e.g., can be configured to provide a constant values for $V_{OUT}$.

Figure 7:
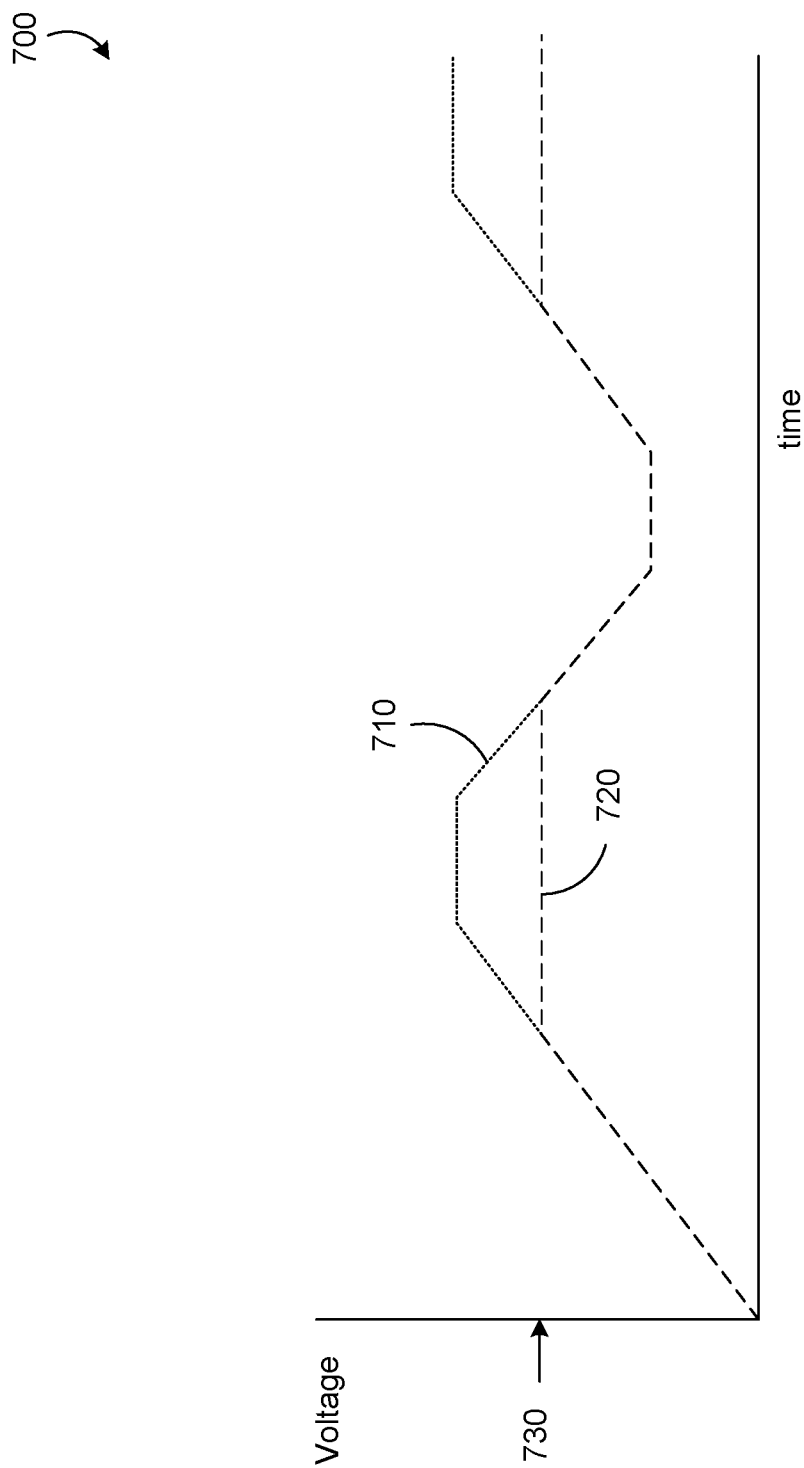
FIG. 7 is a timing diagram illustrating operation of a voltage clamping circuit, such as the voltage clamping circuits of FIGS. 4A and 4B.

FIG. 7 is a timing diagram 700 illustrating simulation results for operation of a voltage clamping circuit, such as the voltage clamping circuits 400a and 400b of FIGS. 4A and 4B. Specifically, the timing diagram 700 illustrates a relationship of the input voltage $V_{IN}$ (shown by trace 710) to the output voltage $V_{OUT}$ (shown by trace 720) during operation of the circuits 400a and 400b. In the timing diagram 700, time is shown along the x-axis and voltage is shown along the y-axis. In FIG. 7, the voltage 730 indicated on the y-axis corresponds with the voltage clamping limit for this example.

As shown in FIG. 7, when the input voltage 710 is less than or equal to the voltage clamping limit 730, the output voltage 720 tracks with (follows, is equal to, etc.) the input voltage 710. As can also be seen in FIG. 7, when the input voltage 710 exceeds the voltage clamping limit 730, the output voltage 720 remains clamped (limited to) the voltage clamping limit 730 (e.g., due to operation of the current sink 440 in the circuits 400a and 400b to discharge the gate of the FET 410, such that FET 410 operates in saturation mode).

Figure 8:
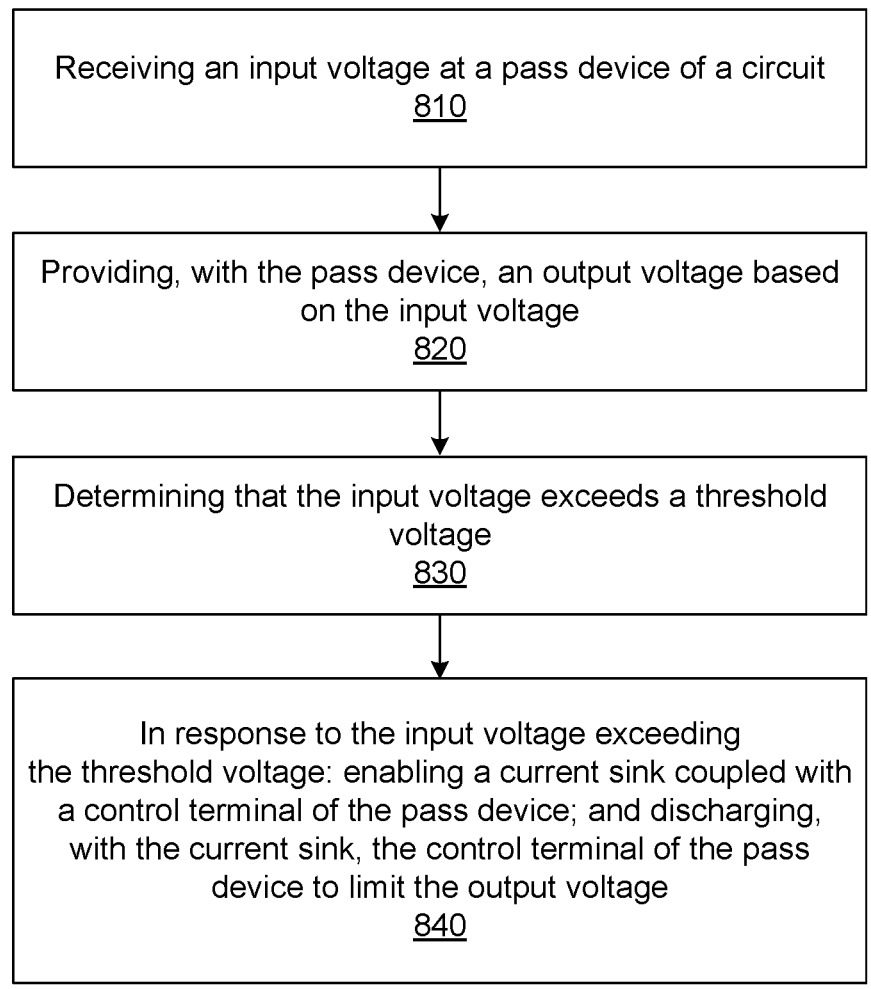
FIG. 8 is a flowchart illustrating a method of clamping a voltage that can be implemented in the circuits of FIGS. 1, 4A and 4B.

FIG. 8 is a flowchart illustrating a method 800 of clamping a voltage that can be implemented, e.g., in the circuits of FIGS. 1, 4A and 4B. Accordingly, for purposes of illustration, the method 800 will be described with further reference to FIGS. 1, 4A, and 4B. It will be appreciated, however, that the method 800 can be implemented in voltage clamping circuits having other configurations.

As shown in FIG. 8, the method 800 includes, at block 800, receiving an input voltage at a pass device of a voltage limiting circuit. For instance, as shown in FIG. 1, the input voltage $V_{IN}$ can be received at the pass device 110, where the pass device 110 can be the n-channel FET 410 of FIGS. 4A and 4B. In some implementations, the pass device 110 can be implemented using an NPN transistor, an n-channel IGBT, or other device, such as described above. At block 820, the method 800 includes providing, with the pass device 110, an output voltage (e.g., $V_{OUT}$), where $V_{OUT}$ is based on $V_{IN}$ (e.g., not-limited or limited, depending to voltage clamping limit and the value of $V_{IN}$).

At block 830, the method 800 includes determining that the input voltage ($V_{IN}$) exceeds a threshold voltage (voltage clamping limit), indicating that limiting of the output voltage ($V_{OUT}$) should be performed, such as is done at block 840 of the method 800. For instance, as shown in FIG. 8, at block 840, the method 800 includes, in response to the input voltage exceeding the threshold voltage: enabling a current sink (140) coupled with a control terminal of the pass device (110); and discharging, with the current sink (140), the control terminal of the pass device (110) to limit the output voltage ($V_{OUT}$). In some implementations, such as the circuit 100, to limit (clamp) the output voltage ($V_{OUT}$), a current sink (140) can be enabled (to sink current) by turning on (closing) a clamp switch (160) that is coupled in series with the current sink (140). As described herein, discharging the control terminal of the pass device (110) can increase a conduction resistance of the pass device, such as by causing the pass device (e.g., n-channel FET 410) to operate in saturation mode, rather than operating in linear mode (e.g., when the input voltage ($V_{IN}$) is below a clamping limit (threshold voltage) of the circuit).

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A circuit comprising:
   a pass device configured to receive an input voltage and provide an output voltage;
   a current sink coupled with a control terminal of the pass device, the current sink being configured to discharge the control terminal of the pass device to limit the output voltage in response to the input voltage exceeding a threshold voltage; and
   a switch coupled in series with the current sink, the switch being configured to enable the current sink in response to the input voltage exceeding the threshold voltage.

2. The circuit of claim 1, wherein the switch is configured to disable the current sink in response to the input voltage being less than or equal to the threshold voltage.

3. The circuit of claim 1, further comprising a voltage reference circuit coupled with a control terminal of the current sink, the voltage reference circuit being configured to generate a voltage corresponding with the threshold voltage.

4. The circuit of claim 3, wherein the voltage reference circuit is configured to:
   be enabled in response to the input voltage being greater than the threshold voltage; and
   be disabled in response to the input voltage being less than or equal to the threshold voltage.

5. The circuit of claim 1, further comprising an overvoltage detection circuit coupled to a control terminal of the switch, the overvoltage detection circuit being configured to:
   turn off the switch to disable the current sink in response to the input voltage being less than or equal to the threshold voltage; and
   turn on the switch to enable the current sink in response to the input voltage being greater than the threshold voltage.

6. The circuit of claim 1, further comprising a charge pump coupled to the control terminal of the pass device, the charge pump being configured to receive the output voltage and provide a control voltage to the pass device, the control voltage being greater than the output voltage.

7. The circuit of claim 1, wherein the pass device includes one of an n-channel field-effect transistor, an NPN bipolar junction transistor, or an n-channel insulated gate bipolar transistor.

8. The circuit of claim 1, wherein the current sink includes one of a p-channel field-effect transistor, or a PNP bipolar junction transistor.

9. The circuit of claim 1, wherein the switch includes one of an n-channel field-effect transistor, an NPN bipolar junction transistor, an n-channel insulated gate bipolar transistor, or a relay.

10. The circuit of claim 1, wherein the current sink is a first current sink, the circuit further comprising:
    a second current sink coupled in series with the first current sink and the switch,
    the second current sink being configured to limit a current conducted through the first current sink and the second current sink.

11. The circuit of claim 1, wherein the pass device is an n-channel field effect transistor (FET), the circuit being configured such that:
    the n-channel FET operates in saturation in response to the input voltage being greater than the threshold voltage; and
    the n-channel FET operates in linear mode in response to the input voltage being less than or equal to the threshold voltage.

12. The circuit of claim 1, wherein limiting the output voltage includes clamping the output voltage to the threshold voltage.

13. A circuit comprising:
    a pass device configured to receive an input voltage and provide an output voltage;

a current sink coupled with a control terminal of the pass device, the current sink being configured to discharge the control terminal of the pass device to limit the output voltage in response to the input voltage exceeding a threshold voltage;

a switch coupled in series with the current sink, the switch being configured to enable the current sink in response to the input voltage exceeding the threshold voltage;

a voltage reference circuit coupled with a control terminal of the current sink, the voltage reference circuit being configured to generate a voltage corresponding with the threshold voltage;

an overvoltage detection circuit coupled to a control terminal of the switch, the overvoltage detection circuit being configured to:

turn off the switch to disable the current sink in response to the input voltage being less than or equal to the threshold voltage; and turn on the switch to enable the current sink in response to the input voltage being greater than the threshold voltage; and a charge pump coupled to the control terminal of the pass device, the charge pump being configured to receive the output voltage and provide a control voltage to the pass device, the control voltage being greater than the output voltage.

14. The circuit of claim 13, wherein the overvoltage detection circuit includes:

a resistor divider configured to generate a divided voltage based on the input voltage; and a comparator configured to compare the divided voltage with a reference voltage, the comparator configured to:

provide a logic signal based on the comparison of the divided voltage and the reference voltage, a first logic value of the logic signal indicating the input voltage is less than or equal to the threshold voltage, and a second logic value of the logic signal indicating that the input voltage is greater than the threshold voltage, the second logic value being opposite the first logic value.

15. The circuit of claim 14, wherein the voltage reference circuit includes:

a current source configured to receive the input voltage; and a resistor coupled in series with the current source.

16. The circuit of claim 15, wherein the switch is a first switch, the voltage reference circuit further including:

a second switch coupled in series with the current source and the resistor, the second switch being controlled by the logic signal, such that the switch is open in response to the logic signal having the first logic value, and closed in response to the logic signal having the second logic value.

17. The circuit of claim 13, wherein the current sink is a first current sink, the circuit further comprising:

a second current sink coupled in series with the first current sink and the switch, the second current sink being configured to limit a current conducted through the first current sink and the second current sink.

18. A method of operating a circuit, the method comprising:

receiving an input voltage at a pass device of the circuit;

providing, with the pass device, an output voltage based on the input voltage;

determining that the input voltage exceeds a threshold voltage; and in response to the input voltage exceeding the threshold voltage:

enabling a current sink coupled with a control terminal of the pass device; and discharging, with the current sink, the control terminal of the pass device to limit the output voltage.

19. The method of claim 18, wherein discharging the control terminal of the pass device increases a conduction resistance of the pass device.

20. The method of claim 18, wherein enabling the current sink includes closing a switch that is coupled in series with the current sink.

* * * * *